(12) United States Patent
Schellenberg et al.

(10) Patent No.: US 7,174,531 B2
(45) Date of Patent: *Feb. 6, 2007

(54) CREATING PHOTOLITHOGRAPHIC MASKS

(76) Inventors: Franklin M. Schellenberg, 4023 Ville Vista, Palo Alto, CA (US) 94306; Patrick J. LaCour, 2112 Fleming Dr., McKinney, TX (US) 75070

(*) Notice: Subject to any disclaimer, the term of this patent is extended or adjusted under 35 U.S.C. 154(b) by 0 days.

This patent is subject to a terminal disclaimer.

(21) Appl. No.: 10/811,418

(22) Filed: Mar. 26, 2004

(65) Prior Publication Data

US 2004/0230937 A1    Nov. 18, 2004

Related U.S. Application Data

(63) Continuation of application No. 09/703,294, filed on Oct. 31, 2000, now Pat. No. 6,728,946.

(51) Int. Cl.
*G06F 17/50* (2006.01)

(52) U.S. Cl. .......................... 716/19; 716/18
(58) Field of Classification Search ............ 716/19–20, 716/1–2, 21, 18; 430/5, 30
See application file for complete search history.

(56) References Cited

U.S. PATENT DOCUMENTS 5,364,716 A    11/1994    Nakagawa et al.

(Continued)

FOREIGN PATENT DOCUMENTS

| DE | 41 21 564 A1 | 1/1992 |
|---|---|---|
| EP | 0 698 916 A2 | 2/1996 |
| WO | WO 99/14636 A1 | 3/1999 |

OTHER PUBLICATIONS

Marc D. Levenson, *Improving Resolution in Photolithography with a Phase-Shifting Mask*, IEEE Transactions on Electron Devices, vol. ED-29, No. 12, Dec. 1982.

(Continued)

*Primary Examiner*—Jack Chiang
*Assistant Examiner*—Binh Tat
(74) *Attorney, Agent, or Firm*—Christensen O'Connor Johnson Kindness PLLC

(57) ABSTRACT

An embodiment of the present invention described and shown in the specification is a system for optimizing data used in creating a photolithographic mask. The system reads a definition of a layer of wafer to be created with a photolithographic mask and defines a number of polygons corresponding to conventional patterns on a mask and polygons corresponding to areas on the mask that are phase shifters. A number of data layers are created and the polygons that define phase shifting areas that shift the phase of light by differing amounts of are grouped in different data layers. Once separated, the system analyzes the polygons in each data layer against one or more design rules and assigns a phase shift amount to all the polygons in a data layer in accordance with the analysis. The polygon definitions in each data layer are then given to a mask maker to fabricate a photolithographic mask. It is emphasized that this abstract is being provided to comply with the rules requiring an abstract and will not be used to interpret or limit the scope or meaning of the claims under 37 C.F.R. § 1.72(b).

31 Claims, 12 Drawing Sheets

U.S. PATENT DOCUMENTS

| | | |
|---|---|---|
| 5,573,890 A | 11/1996 | Spence |
| 5,636,131 A | 6/1997 | Liebmann et al. |
| 5,663,017 A | 9/1997 | Schinella et al. |
| 5,702,848 A | 12/1997 | Spence |
| 5,766,804 A | 6/1998 | Spence |
| 5,766,806 A | 6/1998 | Spence |
| 5,807,649 A | 9/1998 | Liebmann et al. |
| 5,858,580 A | 1/1999 | Wang et al. |
| 5,867,401 A | 2/1999 | Haruki |
| 6,132,908 A * | 10/2000 | Shiraishi et al. ............... 430/5 |
| 6,416,907 B1 | 7/2002 | Winder et al. |
| 6,493,866 B1 * | 12/2002 | Mayhew ...................... 716/21 |
| 6,503,666 B1 * | 1/2003 | Pierrat ........................... 430/5 |
| 6,524,752 B1 * | 2/2003 | Pierrat ........................... 430/5 |
| 6,541,165 B1 * | 4/2003 | Pierrat ........................... 430/5 |
| 6,620,561 B2 | 9/2003 | Winder et al. |
| 6,728,946 B1 * | 4/2004 | Schellenberg et al. ........ 716/19 |
| 6,797,438 B1 * | 9/2004 | Lukanc et al. ................. 430/5 |
| 2002/0129327 A1 * | 9/2002 | Pierrat et al. .................. 716/19 |

OTHER PUBLICATIONS

Hideyuki Jinbo and Yoshio Yamashita, *Improvement of Phase-Shifter Edge Line Mast Method,* Japanese Journal of Applied Physics, vol. 30, No. 11B, Nov. 1991, pp. 2998-3003.

Kazuyuki Inokuchi, Tadashi Saito, Hideyuki Jinbo, Yoshio Yamashita, and Yoshiaki Sano, *Sub-Quarter Micron Gate Fabrication Process Using Phase-Shifting Mask for Microwave GaAs Devices,* Japanese Journal of Applied Physics, vol. 30, No. 12B, Dec. 1991, pp. 3818-3821.

B. J. Lin, *Phase-Shifting Masks Gain an Edge,* IEEE Circuits & Devices, Mar. 1993, pp. 28-35.

Marc D. Levenson, *Wavefront Engineering for Photolithography,* Physics Today, Jul. 1993.

Harafuji, Kenji et al., "A Novel Hierarchical Approach for Proximity Effect Correction in Electron Beam Lithography," IEEE Transaction on Computer-Aided Design of Integrated Circuits and Systems, *IEEE* 12(10):1508-1514, New York, Oct. 10, 1993.

* cited by examiner

CREATING PHOTOLITHOGRAPHIC MASKS

CROSS-REFERENCE TO RELATED APPLICATION

This application is a continuation of application Ser. No. 09/703,294, filed Oct. 31, 2000 now U.S. Pat. No. 6,728,946, which is incorporated herein by reference.

FIELD OF THE INVENTION

The present invention relates to photolithographic processing.

BACKGROUND OF THE INVENTION

In order to create faster and more powerful integrated circuits, circuit designers are increasing the number and decreasing the size of circuit elements that are placed on an integrated circuit. With conventional photolithography, the minimum size of an object that can be created on a silicon wafer depends directly on the wavelength of light used to expose the wafer and inversely on the numerical aperture of the lens through which the light that exposes the wafer is passed. Because the costs associated with decreasing the illumination wavelength or increasing the numerical aperture can be prohibitive, chip manufacturers are continually looking for techniques that can create smaller objects on a wafer using existing photolithographic equipment.

One of the most powerful techniques for increasing the density of an integrated circuit with existing photolithographic equipment is with the use of phase shifters. As discovered by Marc Levenson of IBM and others, the phase of the light that strikes a wafer can be manipulated to destructively interfere at desired locations on the wafer in order to enhance image contrast and reduce diffraction effects that occur when the light passes through a pattern of opaque areas on a semiconductor mask. In addition, by selectively placing phase shifters on the mask, subwavelength features can be created on the wafer to form circuit elements.

While the use of phase shifting structures on a photolithographic mask allows increased contrast and the creation of subwavelength features using existing photolithographic equipment, the phase shifters are relatively expensive to create and may introduce errors into the mask. Therefore, there is a need for a method and apparatus for optimizing the creation of phase shifters on a mask that minimizes the possibility of errors and facilitates the production of the mask.

SUMMARY OF THE INVENTION

A method and apparatus for optimizing data used in the creation of a photolithographic mask. The apparatus includes a computer system for reading data that describes a desired physical layer of an integrated circuit. The computer creates multiple data layers and groups data structures that define different areas on the mask into one of the multiple data layers. After the data structures are defined and grouped into one of the data layers, the data structures grouped in one or more of the data layers are analyzed according to one or more design rules. One or more properties of the data structures are then assigned in accordance with the analysis performed.

In a currently preferred embodiment of the invention, the invention is used to optimize data that defines phase shifters on a photolithographic mask. The computer system creates data structures that define polygons that correspond to circuit elements and polygons that correspond to phase shifters on the mask. Polygons are then placed in one of the corresponding data layers. All the polygons associated with circuit features are grouped in one data layer and the polygons associated with distinct phase shift areas are grouped in separate data layers. The phase shifting polygons in the data layers are analyzed and a phase shift amount is assigned to each of the polygons after the polygons have been created, and based on the design rule analysis. In one embodiment of the invention, the design rules operate to minimize an etched area of the mask.

The present invention is not limited to the optimization of data used to create masks for integrated circuits. The present invention can also be used to optimize data used to create micro electro-mechanical structures (MEMS), thin film heads for disk drives or other devices created with photolithographic processes.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

As indicated above, the present invention is a method and apparatus for optimizing data for the creation of circuit elements on a photolithographic mask and, in particular to the optimization of data for the creation of phase shifters on a photolithographic mask.

Figure 1A:
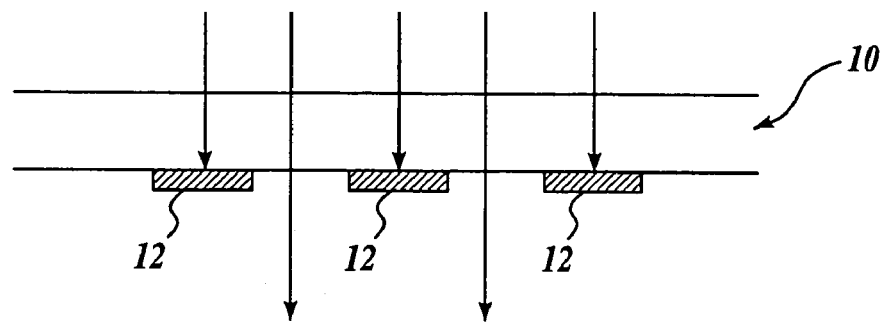
FIGS. 1A–1H illustrate cross sections of various types of known phase shifting elements that may be incorporated into a photolithographic mask.

FIGS. 1A–1H illustrate various types of structures commonly used on photolithographic masks. As shown in FIG. 1A, a mask 10 typically comprises a transparent substrate, typically quartz or glass, having a number of opaque areas 12, typically fabricated from chrome, disposed on one surface thereof. This is typically called a conventional, chrome-on-glass (COG) mask. The mask 10 is placed into a wafer processing machine whereby light is passed through the mask 10 and an image of the mask is formed on the surface of a silicon wafer (not shown) that is covered with a photosensitive material. The light exposes portions of the photosensitive material and the exposed/unexposed areas of the photoresist material are then processed in order to create a pattern on the wafer corresponding to the pattern of opaque areas 12 on the corresponding mask 10.

Figure 1F:
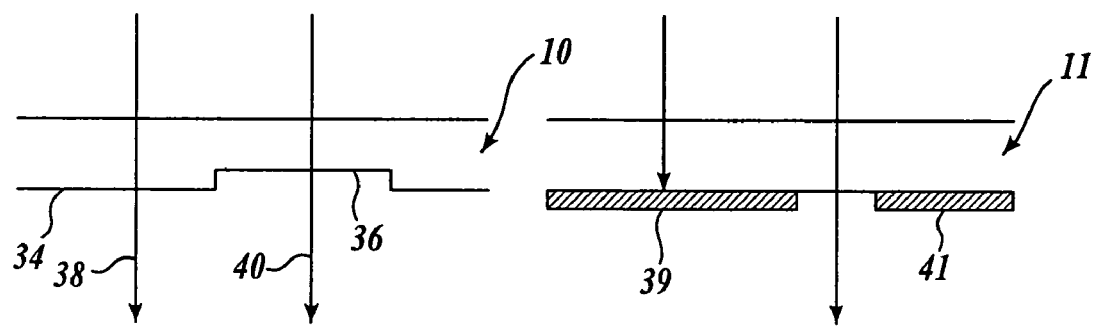
Figure 1B:
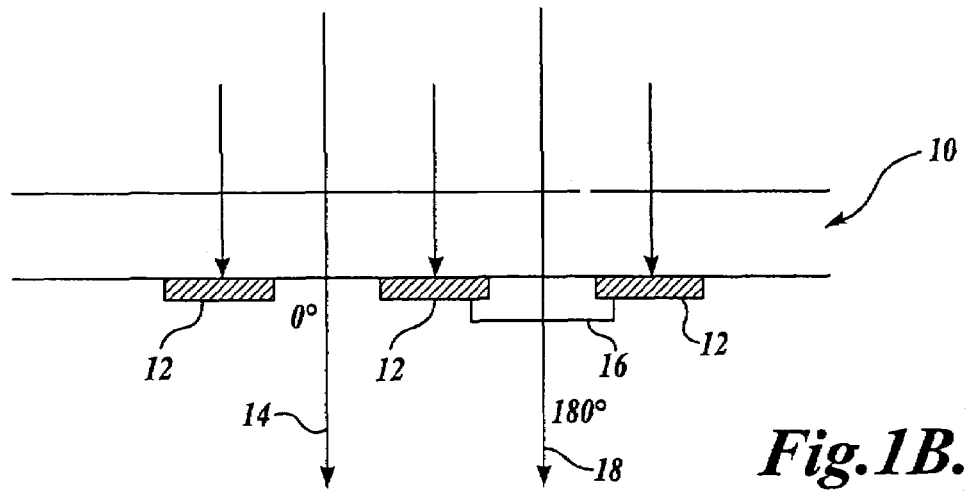

In order to improve the contrast between adjacent features on the wafer or to create features that are smaller than the wavelength of the light used to expose the wafer, the mask 10 may include one or more phase shifters, as shown in FIG. 1B. Light passing directly through a transparent area of the mask 10 as indicated by the beam 14 forms a reference against which the phase of phase shifted illumination light is compared. Clear areas of the mask are typically referred to as zero degree (0°) areas. The phase of the light passing through the mask 10 may be adjusted by adding a layer of transparent material 16 to the surface of the mask 10. The thickness of the material 16 added can be varied in order to control the phase of the light passing through that area of the mask 10 with respect to the phase of the light passing through a 0° area of the mask 10. For example, light passing through an additional layer of material 16, as indicated by the beam 18, is 180° out of phase with the light beam 14. When light beams that are 180° out of phase intersect on the silicon wafer, the lightwaves destructively interfere, thereby enhancing the contrast between exposed portions on the wafers that are created by adjacent opaque areas 12 on the mask 10.

Figure 1C:
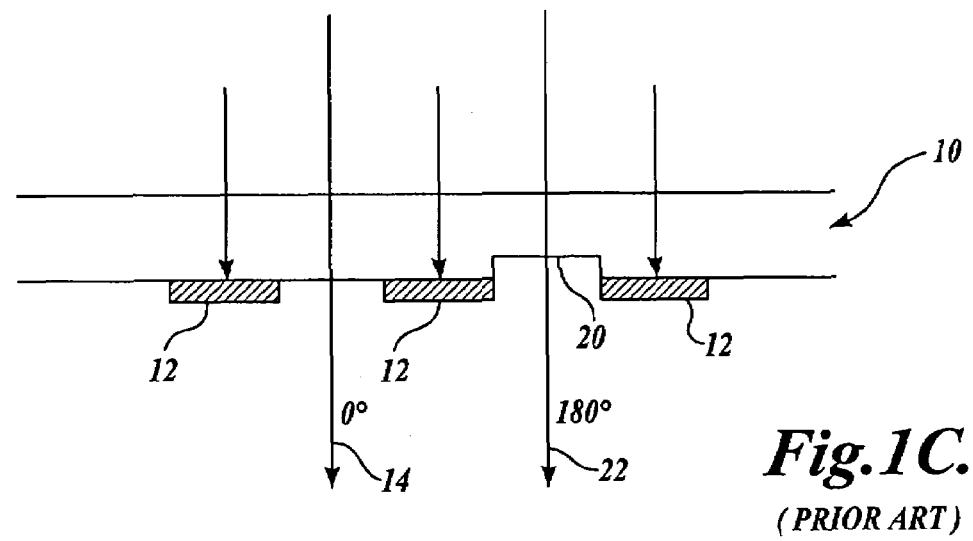

The phase of the light passing through the mask also can be adjusted by etching an area into the mask in order to reduce its thickness. FIG. 1C shows a mask 10 having an area 20 that has been etched to shift by 180° the phase of the light passing through the area as indicated by the light beam 22.

Figure 1D:
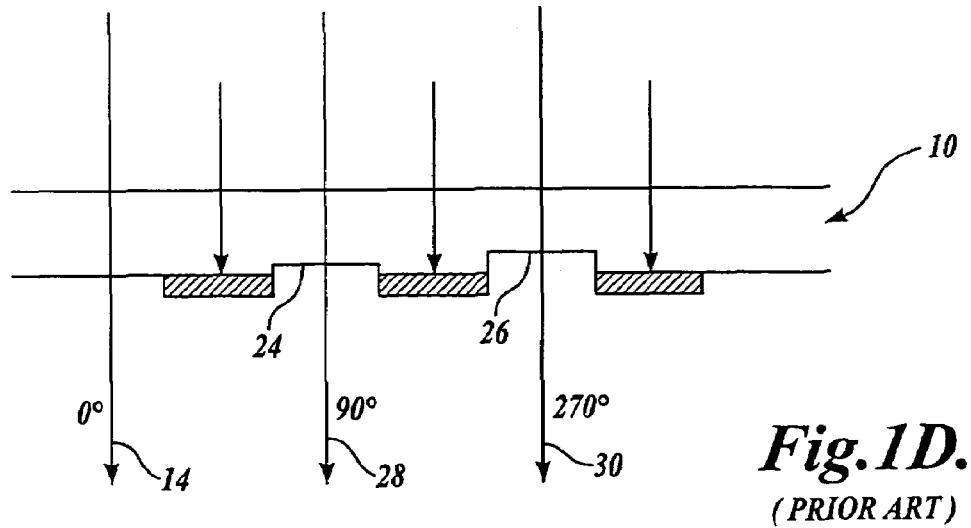

As long as the relative phase shift between adjacent phase shifting areas is 180°, the contrast enhancement is still achieved. FIG. 1D shows a mask 10 having an area 24 that has been etched to shift the phase of the illumination light by 90° with respect to light that passes through a 0° area of the mask. The mask 10 also includes an area 26 that is etched to shift the phase of the illumination light by 270°. Light passing through a 0° area, indicated by the light beam 14, and a 90° area, as indicated by the light beam 28, will not destructively interfere to create a sub-wavelength feature on the wafer. Similarly, light passing through the 270° phase shift area, as indicated by the light beam 30, will not destructively interfere with light passing through a 0° portion of the mask 10 to create sub-wavelength features. Only light passing through adjacent 90° and 270° phase shift areas will create sub-wavelength features. Using 90° and 270° phase shifters allows greater flexibility in the layout of phase shifting masks. However, having phase shifters etched to different depths on the mask generally makes the mask more expensive to manufacture.

Figure 1E:
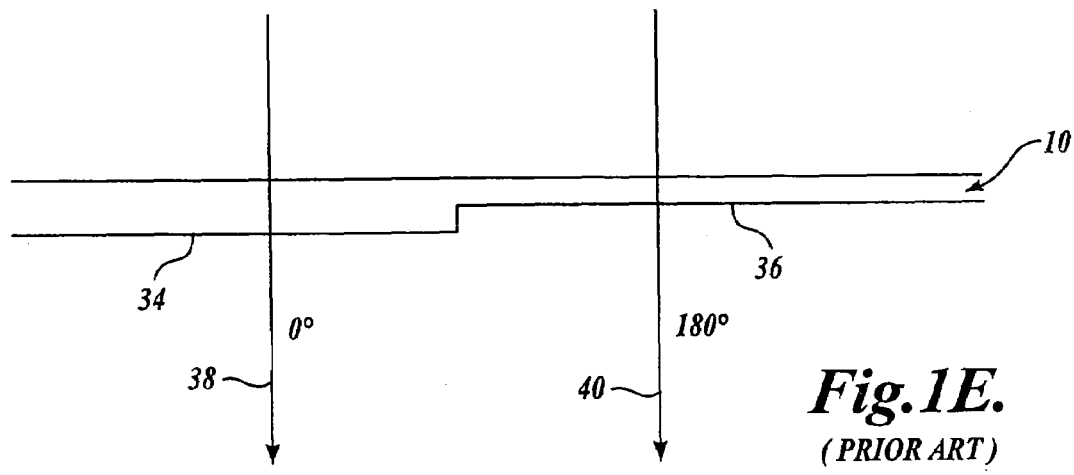

The use of phase shifters is not limited to enhancing the contrast between adjacent apertures separated by opaque areas on a mask. A phase shifting area can be placed inside a clear area on the mask in order to create sub-wavelength features on the wafer. FIG. 1E illustrates a mask 10 having a 0° area 34 that is adjacent a 180° phase shift area 36. Light passing through these areas, as indicated by the beams 38 and 40, destructively interfere at the wafer thereby producing an unexposed pattern that can form a desired element on the wafer.

As is well known to those of ordinary skill in the art, at each location on the mask where a 180° phase shift area borders a 0° phase shift area, destructive interference will create a sub-wavelength feature on the wafer. Because each phase shifting region must have a closed boundary, additional features may appear in undesirable locations. These undesired features can be removed with a trim mask 11 having opaque areas 39, 41, as shown in FIG. 1F that shield desired portions of the sub-wavelength features and expose undesired portions of the sub-wavelength features.

Figure 1G:
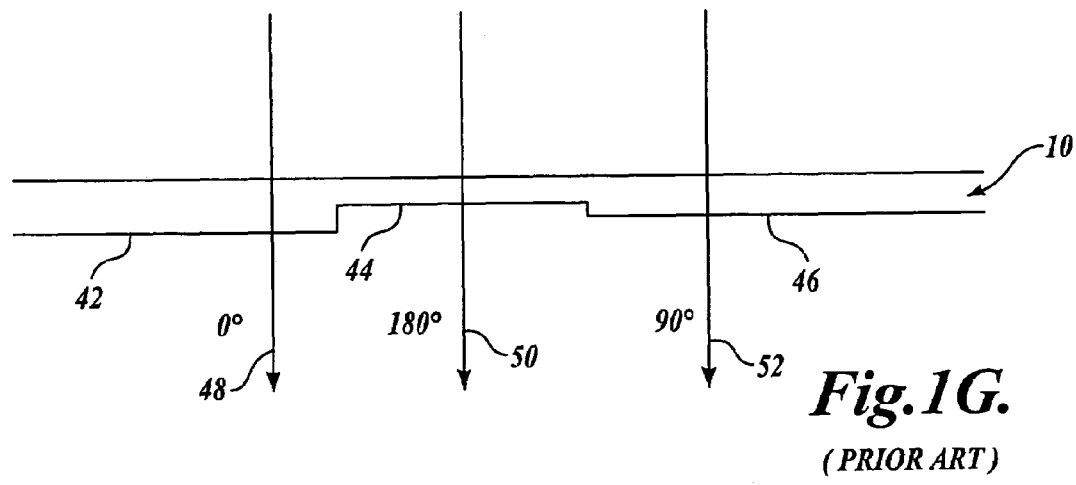

FIG. 1G illustrates the use of multiple adjacent phase shifting areas on a mask 10. The mask 10 includes a 0° phase shifting area 42 that is adjacent to a 180° phase shifting area 44 that, in turn, is adjacent a sequence of 90° phase shifting areas 46. Light passing through the 0° and 180° degree areas, as indicated by beams 48 and 50, will destructively interfere on the wafer to create a sub-wavelength unexposed area. Light passing through the 180°0 phase shift area indicated by the beam 50 and the 90° phase shift area as indicated by the beam 52 or at the boundary of the 90° and 0° regions will not interfere to create a sub-wavelength feature. Thus, placing a 90° phase shift area between a 0° and a 180° phase shift area on the mask 10 can reduce or eliminate the unwanted sub-wavelength features that would otherwise be created at the boundaries of a 180° and 0° phase shift area without a trim mask. However, these masks are more complex and therefore more expensive.

Figure 1H:
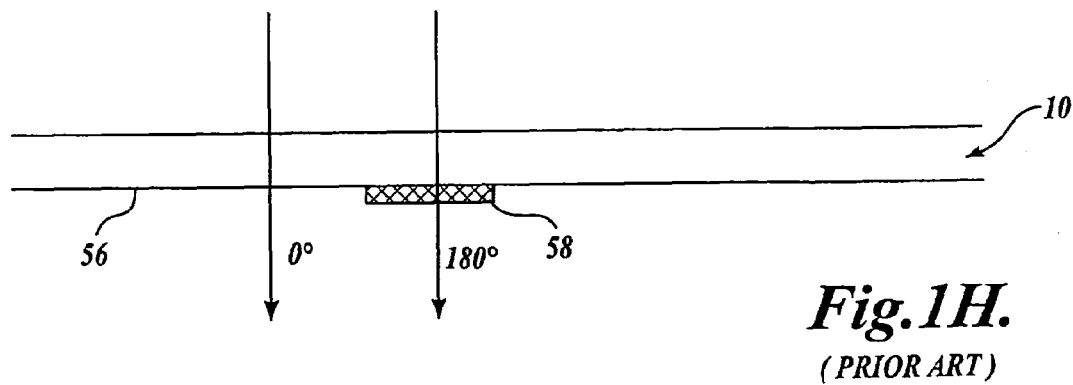

An alternate approach of creating a phase shifter is to alter the material used to make the opaque patterns on the mask 10. Such patterns are generally created with opaque chromium. By making the chromium thin enough, or using specially developed partially transmitting materials such as Molybdenum silicide, the material becomes semi-transparent and alters the phase of the light passing through it by 180°, but decreases its amplitude. FIG. 1H shows a mask 10 having a 0° phase shift area 56 and a semi-transparent pattern 58. Light passing through the semi-transparent pattern 58 is shifted 180° with respect to light passing through the 0° area 56 of the mask in order to enhance the contrast between adjacent features. Uniform phase shifting can be achieved by creating a uniform layer of the material.

As will be appreciated, the semi-transparent pattern 58 increases the overall amount of light that reaches the wafer. Therefore, portions of the semi-transparent pattern may be covered with an opaque chrome layer to produce a "tri-tone" mask as will be described in further detail below.

Figure 2B:
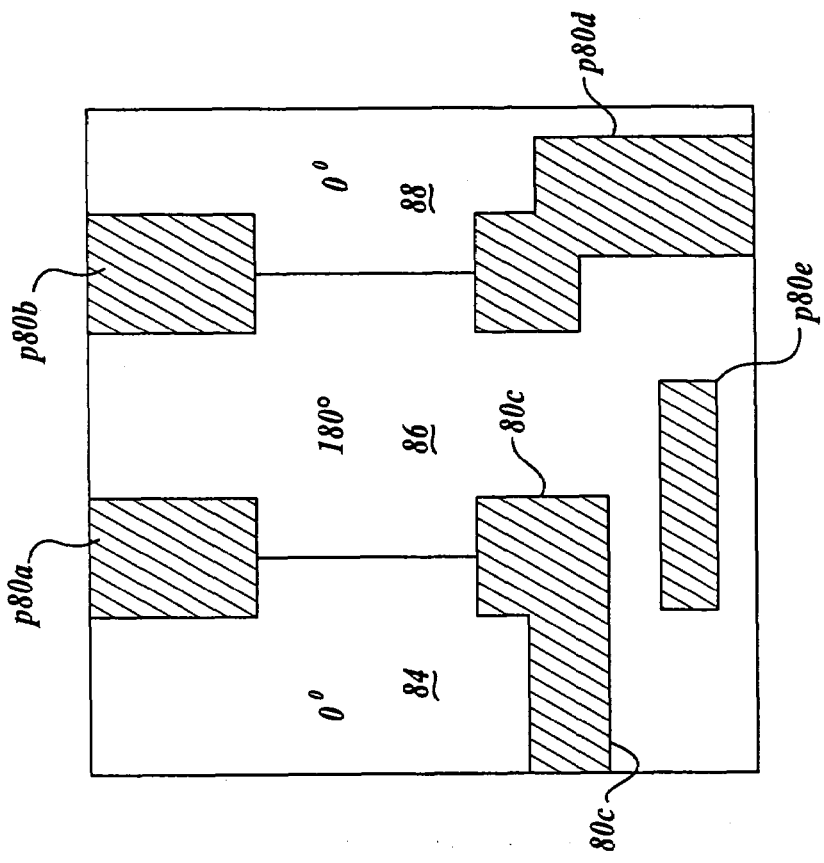
FIGS. 2A and 2B illustrate a portion of a desired circuit and how phase shift values are conventionally assigned to adjacent phase shifting areas on a mask.
Figure 2A:
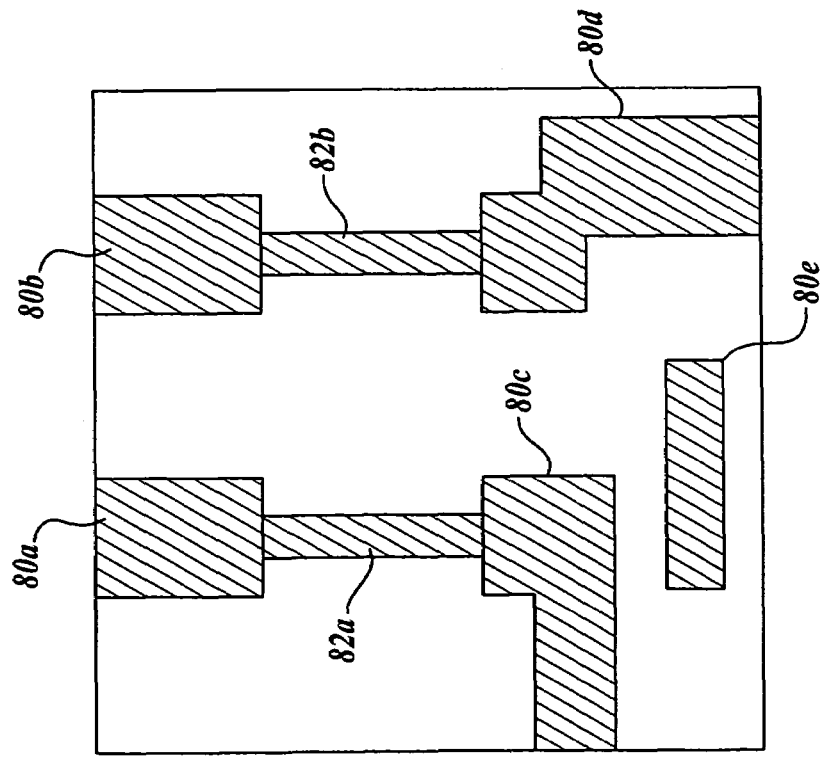
Figure 3:
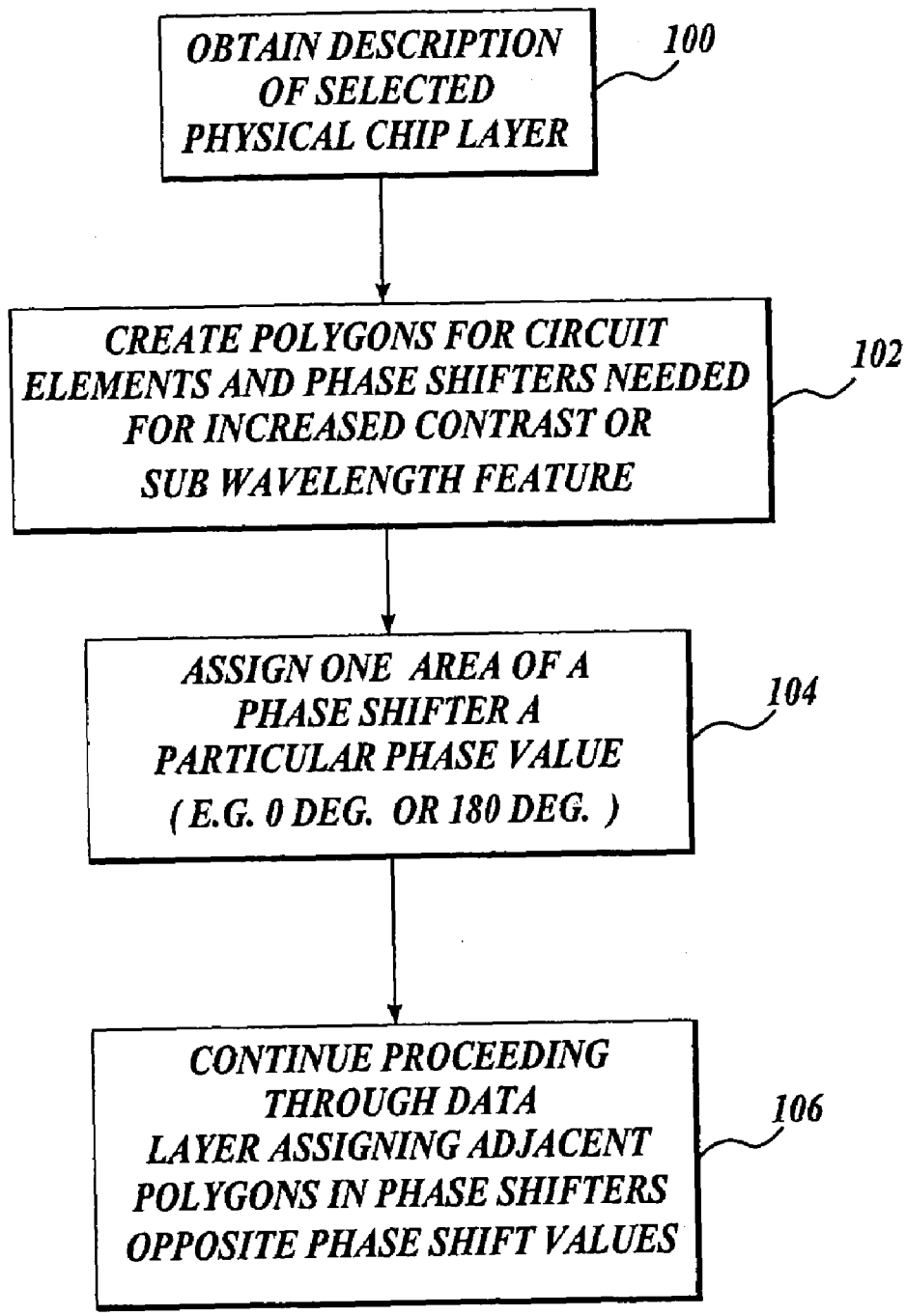
FIG. 3 is a flow chart of the conventional steps performed to assign phase shift values to areas of a phase shifter.

While the use of phase shifters permits integrated circuits with an increased density to be created with existing photolithographic equipment, their use generally increases the cost of producing the mask and may introduce errors into the mask. FIGS. 2A–2B and 3 illustrate the conventional method by which phase shifters are added to a photolithographic mask. FIG. 2A shows a portion of a desired circuit to be created on a silicon wafer. The circuit includes a number of polysilicon elements 80a–80e that are large enough to be created by a conventional COG photolithographic mask. In addition, the circuit includes two gates 82a and 82b that are sub-wavelength features.

To prepare the data for a mask that will create the desired layout on a silicon wafer, the process steps shown in FIG. 3 are usually performed. It should be noted that the term "mask" in photolithographic processing technically refers to an object that is placed in direct contact with a wafer during processing, as opposed to a reticle which is positioned at some distance away from the wafer during processing. However, for purposes of the present specification, the term "mask" is intended to have its more colloquial definition and refer to both contact masks and reticles. Beginning with a step 100, a computer file containing a description of the circuit layout is received and provided to a layout manipulation program. A layout manipulation and verification program takes the description of the circuit elements and defines a number of polygons that in turn correspond to areas on one or more photolithographic masks at a step 102. For example, to create the circuit element 80*a*, the layout manipulation program defines a polygon p80*a* (FIG. 2B) that describes the dimensions of a portion of a mask that will create the element 80*a* when the mask is illuminated. In addition, the layout manipulation program detects that the gates 82*a* and 82*b* are too small to be created using a convention mask and therefore generates polygons that ensure that the mask includes phase shifting regions 84, 86 and 88 that will create these sub-wavelength features by destructive interference. The description of the polygons that define areas the mask is generally referred to as a GDS II data layer for the format of a language commonly used to describe the polygons, although other data formats can also be used.

At a step 104, the layout manipulation program makes an initial phase selection for one of the phase shift areas. For example, if the circuit designer selects a design using 0° and 180° phase shift areas, the layout manipulation program will select either 0° or 180° as the phase shift for the first area. Processing then continues at a step 106 where the layout manipulation program continues through the data layer assigning each phase shift area a phase shift amount that is the opposite of its neighboring phase shift area. In the example shown in FIG. 2, the phase shift area 86 is assigned 180° of phase shift and the area 88 is assigned 0° of phase shift.

The problem with the approach shown in FIGS. 2B and 3 is that the arbitrary phase assignments that can occur when simple rules are executed for the assignment of phase shift values at the same time the polygons are generated can result in sub-optimal masks. For example, masks with large etched areas may contribute to errors on the mask. As shown in FIG. 2B, the area 86 that is etched to produce 180° of phase shift completely contains the polygon p80*e*. Having an etched area that completely surrounds a chrome feature on the mask can cause etching of the chrome itself, changing the dimensions and increasing the number of defects on the mask. Repair of these defects may be difficult and time consuming, increasing the cost of the mask.

Figure 4A:
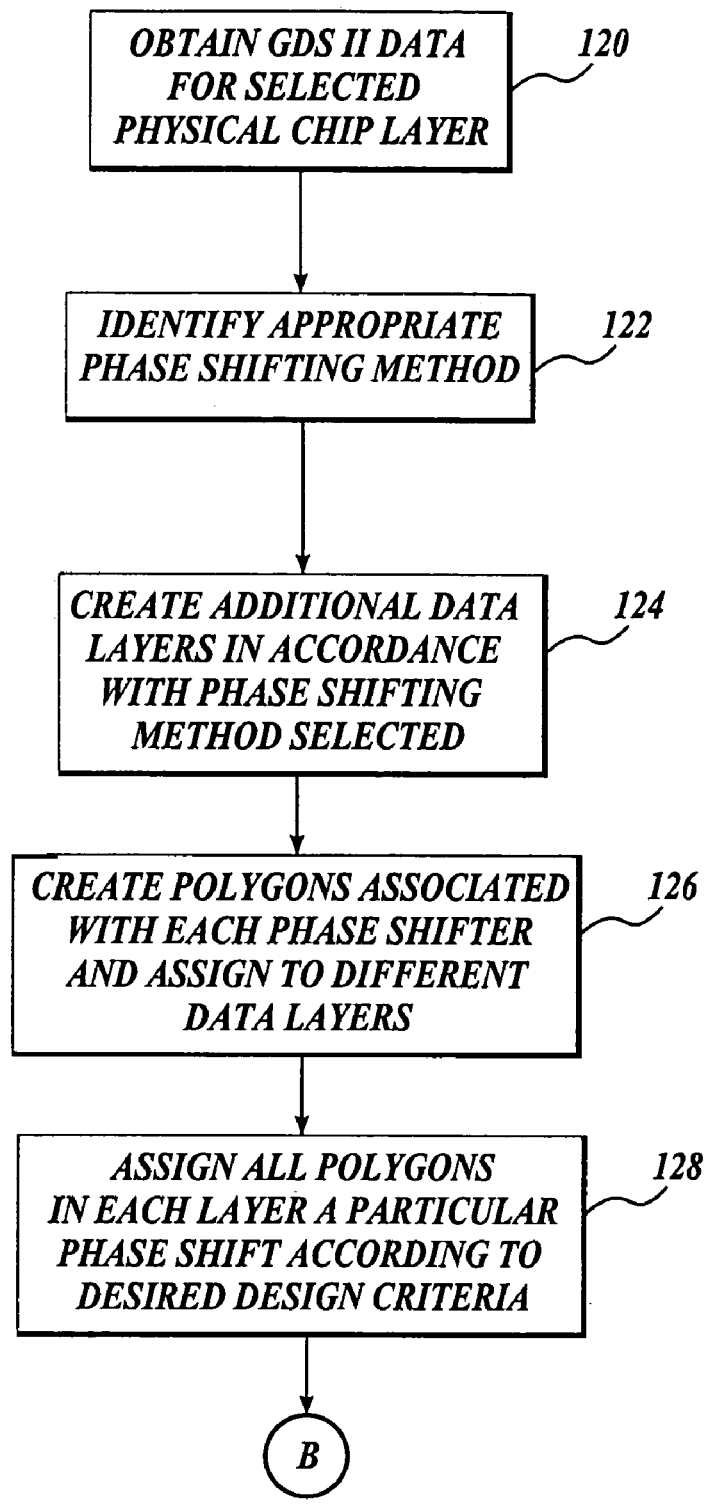
FIGS. 4A–4B illustrate a flow chart of the steps performed by one embodiment of the present invention to optimize the assignment of phase shift values to areas of phase shifters.
Figure 4B:
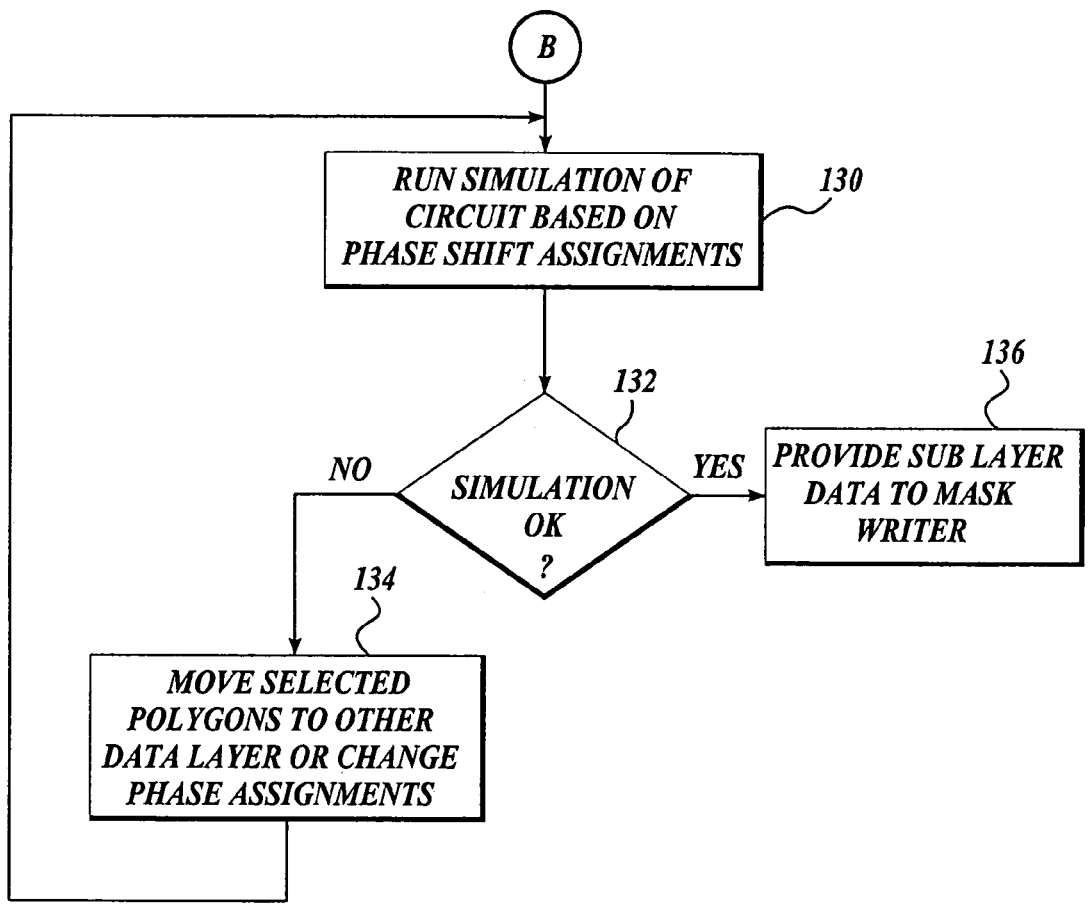

To improve the creation of phase shift areas on a mask, one embodiment of the invention performs the steps shown in FIGS. 4A–4B. Beginning with a step 120, the data layer for a selected physical chip layer is obtained. For example, the physical chip layer may be the polysilicon device layer that specifies a particular pattern of transistors to be created on the wafer. At a step 122, a layout manipulation program, such as is part of Calibre™ produced by Mentor Graphics Corporation of Wilsonville, Oreg., the assignee of the present invention, is executed by a computer system to determine the appropriate phase shifting method—either by prompting a user to make a selection or based on one or more design rules. At a step 124, the computer creates a number of data layers depending on the type of phase shifters to be used. For example, if a 0° and 180° phase shifting scheme with double exposure is used, the computer system creates four data layers. One data layer is created for the circuit elements that can be created with conventional patterns formed on a mask, one data layer is created for each phase shifting portion of the phase shifters, as will be explained below, and one data layer is created for a trim mask. If a 90°/270° phase shifting scheme is used, the computer system creates three data layers since no trim mask is needed. It should be noted that the data layers do not correspond to distinct layers of the circuit to be fabricated as distinct masks, but correspond to separate data structures such as arrays, files or other storage mechanisms in which the polygons grouped therein can be analyzed. At the time of creation, these data layers are generally empty, and do not yet contain any polygons.

At a step 126, the layout manipulation program creates those polygons that define different phase shifting areas of the phase shifters and places them into one of the different data layers created.

Selecting an actual phase shift amount for each of the polygons in the different data layers does not yet occur. Preferably, after the polygons are created, the assignments made. At a step 128, the layout manipulation program makes a phase shift selection for all the phase shift polygons in the same data layer in accordance with a desired design criteria. For example, it may be advantageous to minimize the area of the 180° phase shift areas on the mask. Therefore, the layout manipulation program sums the area of each phase shifting polygon included in each data layers. The polygons in the data layer having the minimum combined area can be defined as the 180° phase shift regions. Alternatively, the selection of which polygons define the 180° phase shift areas may be made based on other design criteria, such as proximity to circuit elements in other layers, or the predictive results of a simulation algorithm.

At a step 130, the layout manipulation program may run a simulation of the circuit based on the phase assignments made at step 128. At a step 132, it is determined if the simulation is acceptable. If not, processing can proceed to a step 134 and selected phase shifting polygons can be reassigned to another data layer or the phase shift assignment for the entire data layer can be changed. After step 134, processing returns to step 130 and the simulation is performed again. Once the simulation is acceptable, processing proceeds to a step 136, whereby the polygon definitions for each of the data layers is provided as input to a mask writer to create the mask for the physical chip layer.

Figure 5:
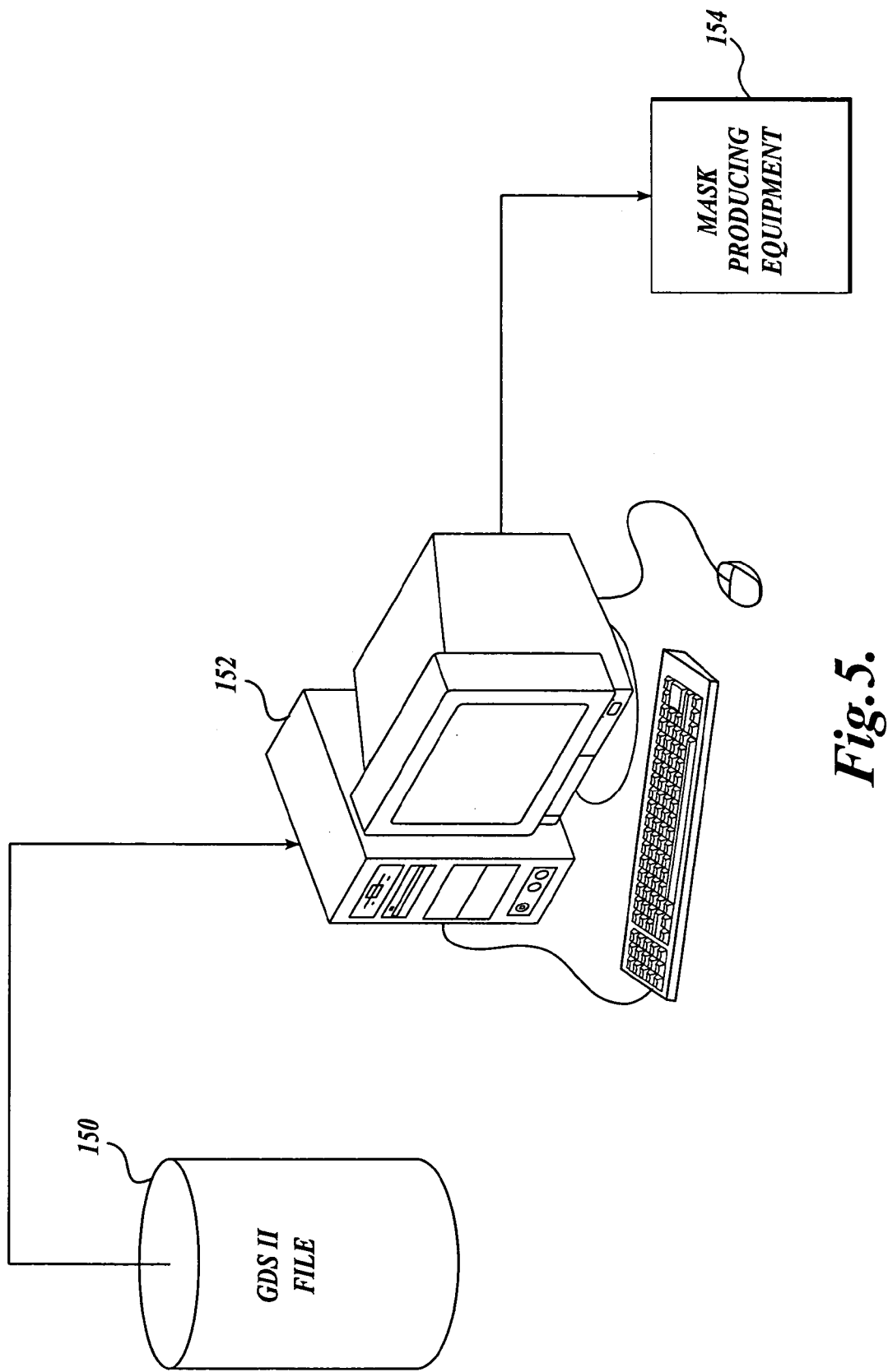
FIG. 5 illustrates a computer system for performing the method outlined in FIG. 4.

FIG. 5 illustrates the basic components of a hardware system that implements the present invention. A database 150 stores GDS II layer data for each physical layer of an integrated circuit to be created. The data is read by a computer system 152 that executes a program that implements the functions outlined in FIGS. 4A–4B and described above. Once the data layers have been created, the polygon definitions have been divided among the data layers and the phase assignments for the phase shifting areas selected and the design verified, the polygon definitions in each data layer are supplied as input to a mask data processor 154 that controls the production of the actual photolithographic mask.

Figure 6B:
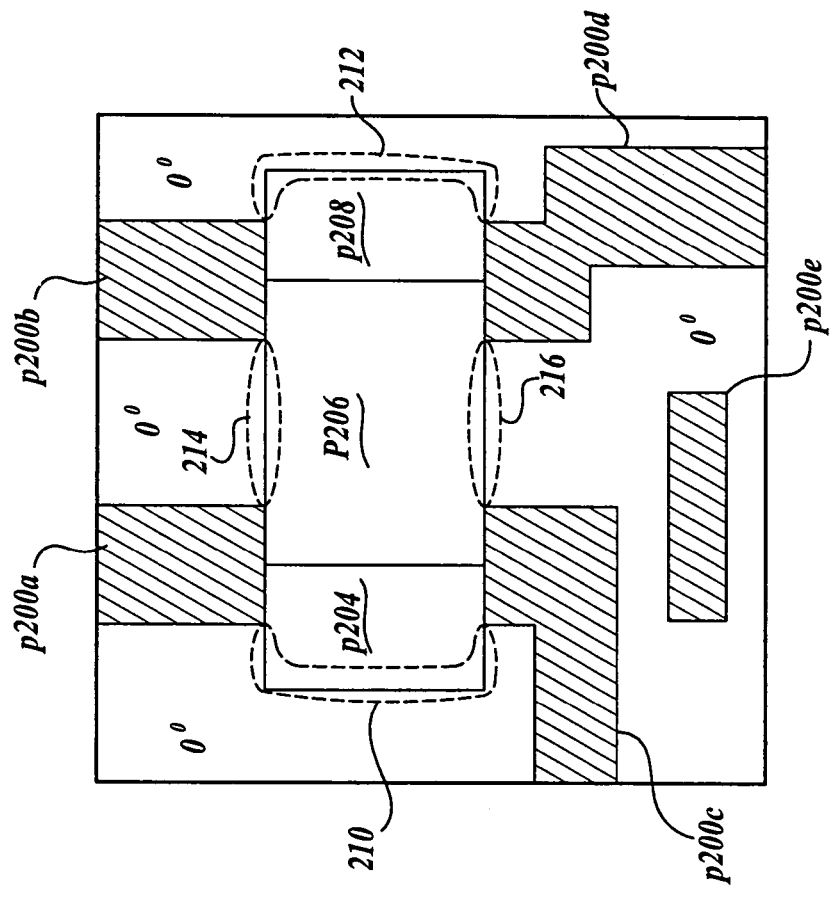
FIGS. 6A–6G illustrate a portion of a desired circuit and how the present invention optimizes the assignment of phase shift values.
Figure 6A:
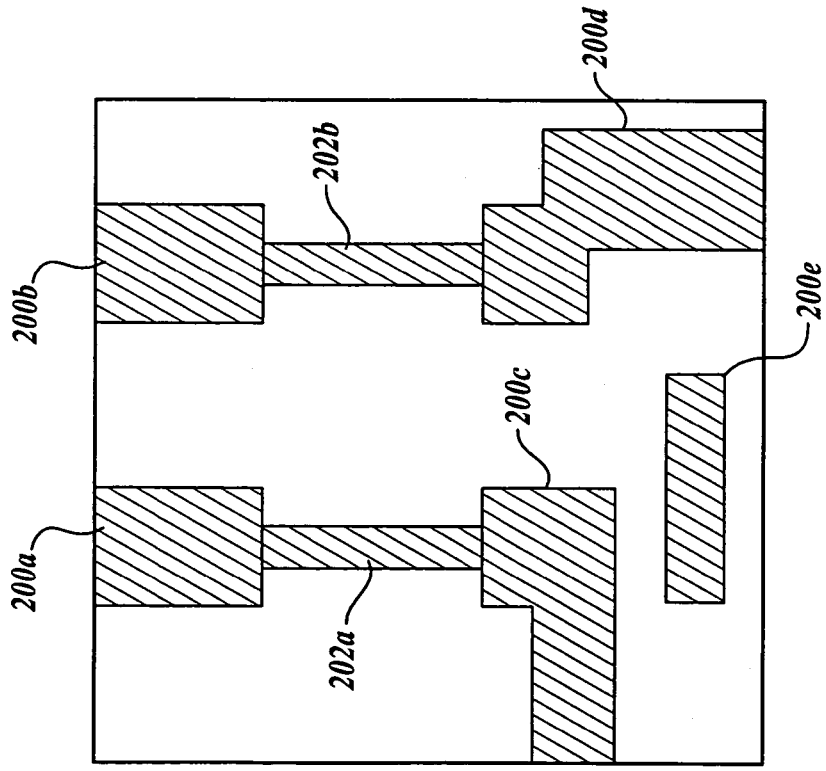

FIGS. 6A–6G illustrate how one embodiment of the present invention operates with an actual circuit design. FIG. 6A illustrates a portion of a desired integrated circuit design including a number of circuit elements 200*a*–200*e* that are large enough to be created with conventional mask patterns. In addition, the desired circuit design includes a gate 202*a* that connects element 200*a* with element 200*c* and a gate 202*b*, which connects circuit element 200*b* with circuit element 200*d*. In the example shown in FIG. 6A, gates 202*a*, 202*b* are too small to be created with a conventional mask. Therefore, the layout manipulation program knows that these elements must be created with the use of phase shifters.

FIG. 6B illustrates polygons created by the layout manipulation program in order to produce the mask or masks that will in turn be used to create the circuit elements shown in FIG. 6A. The layout manipulation program defines a series of polygons p200*a*–p200*e* that correspond to the circuit elements 200*a*–200*e*, respectively. Each of these polygons, for example polygon p200a, defines an area on the mask that will create the corresponding element 200a on the wafer without the use of the phase shifter. If the mask is a bright field mask, the polygon p200a will be defined as an opaque area on the mask surrounded by clear or 0° phase shift areas. If the mask is a dark field mask, the area of the polygon p200a will be defined as clear and surrounded by opaque areas. In addition, the layout manipulation program defines polygons p204, p206 and p208 that correspond to phase shift areas on the mask that together will create the two sub-wavelength gates 202a and 202b. The sizes of the polygons p204, p206, and p208 are minimized as compared with the size of the phase shifting regions 84, 86 and 88 created with conventional techniques as shown in FIG. 2.

Figure 6D:
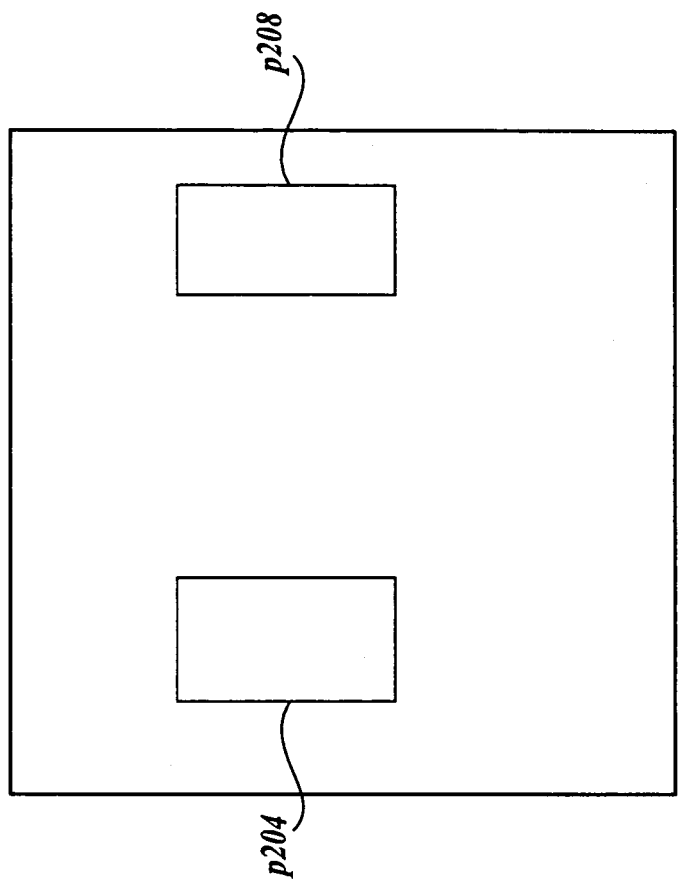
Figure 6C:
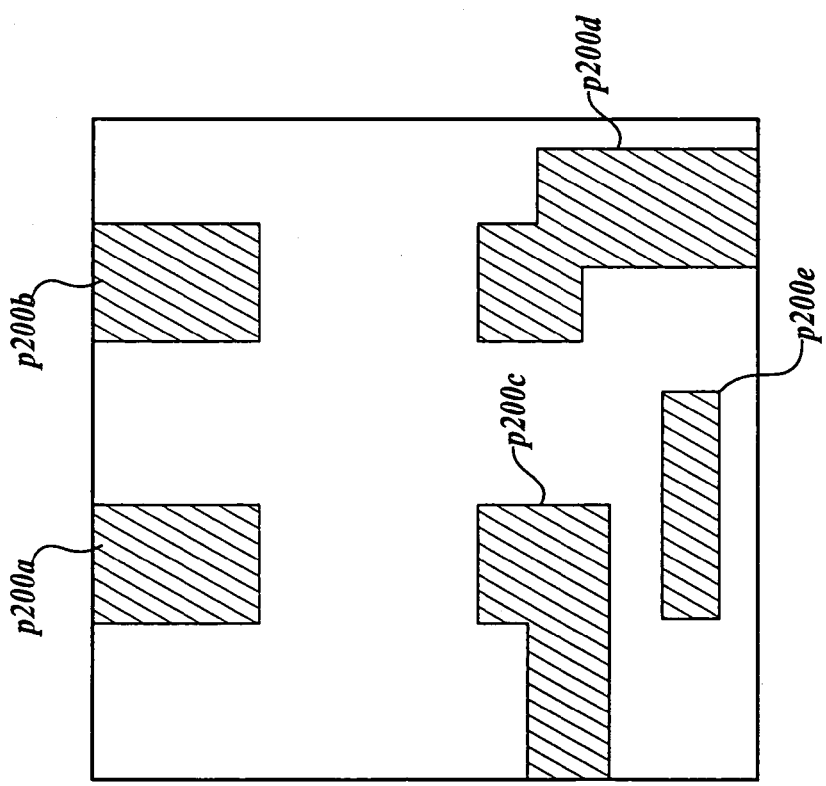
Figure 6F:
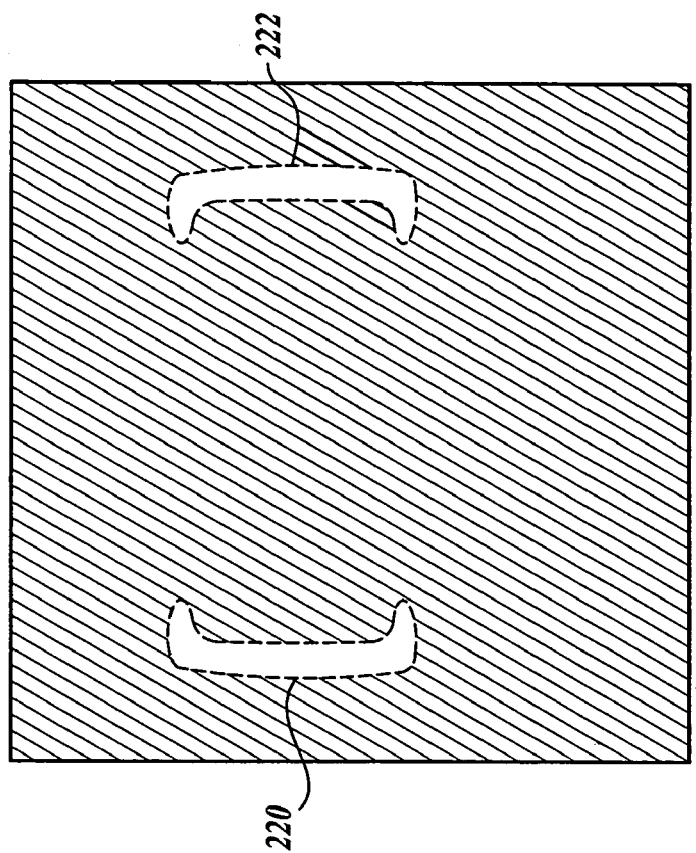
Figure 6E:
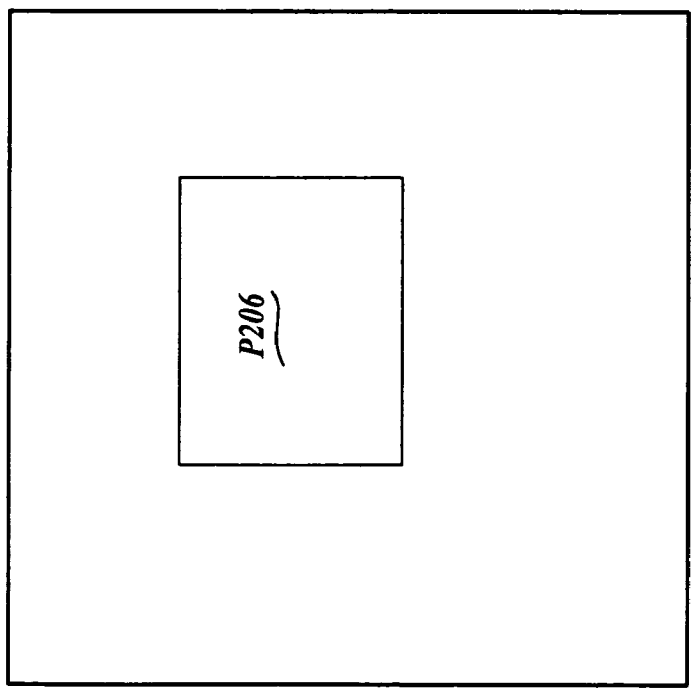

As indicated above, one embodiment of the present invention separates the polygons created into one of several data layers. Each polygon that corresponds to a conventional pattern on the mask is placed in one data layer as shown in FIG. 6C. In addition, the polygons that define different phase shifting areas of a phase shifter are placed in different data layers. For example, polygons p204 and p208 are placed in one data layer as shown in FIG. 6D and the polygon p206 for the other phase shifting area is placed in another data layer as shown in FIG. 6E.

Once the polygons associated with different phase shift areas are placed in separate data layers, the layout manipulation program makes a phase selection for the polygons in the data layers according to a desired design criteria. For example, if the design criteria specifies that the area of etched phase shift regions is to be minimized, the computer system sums the area of the polygons p204 and p208 within the data layer shown in FIG. 6D and compares the total area with the summed area of the polygons contained in the data layer shown in FIG. 6E. Depending upon which data layer has the polygons with the smallest summed area, those polygons can be selected to have a 180° etched phase shift. Once the computer system has made an initial phase shift selection for all the polygons in a data layer, a simulation can be performed on the circuit layout to ensure that the circuit will perform as desired.

Figure 6G:
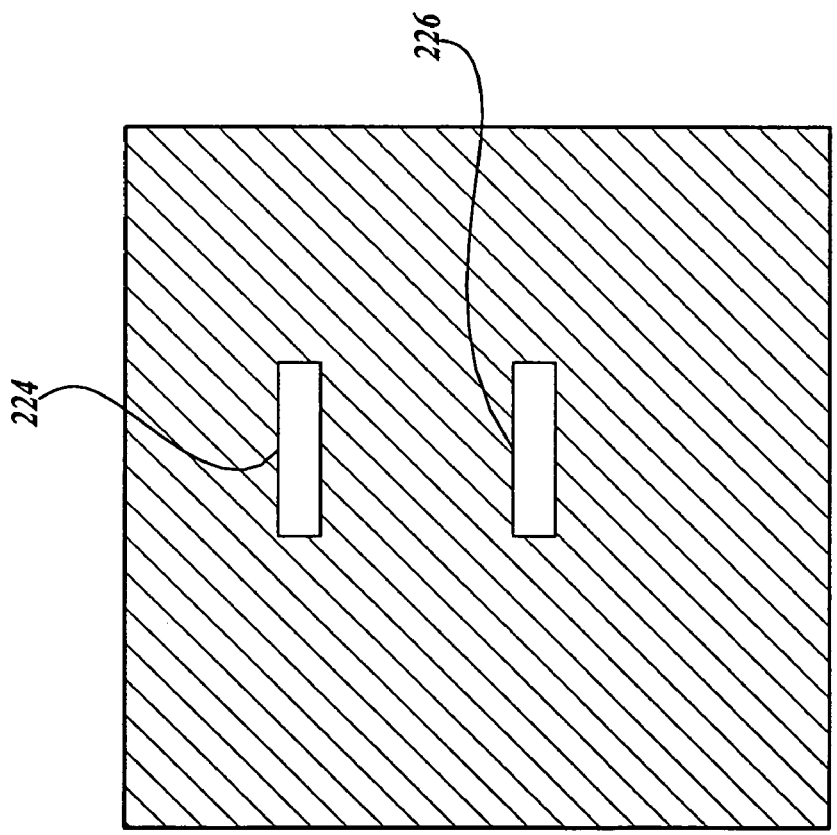

As will be appreciated, depending upon the selection of the phase shift values for the various polygons that define the phase shifters, the appropriate trim masks can then be defined. For example, if the polygon p204 and p208 are selected to have 180° phase shifts, then subwavelength artifacts will be created in the areas 210 and 212 is shown by the dashed lines in FIG. 6B. Therefore, a data layer that defines a trim mask as shown in FIG. 6F can be created by the layout manipulation program. The trim mask is opaque except for the areas 220 and 222. Illumination of the wafer through the trim mask removes the undesired artifacts created at the boundaries of a 0° and 180° phase shift area. Alternatively, if the polygon p206 is selected to have a 180° phase shift, then artifacts will be created in the areas 214 and 216 shown by the dashed lines in FIG. 6B. Therefore, a data layer that defines a trim mask as shown in FIG. 6G is created. The trim mask is opaque except for areas 224 and 226.

As will be appreciated, trim masks are only required if 0° and 180° phase shifters are used. If alternate phase shifting schemes such as 90°/270° or 60°/120° phase shifters are used, then no trim masks need be created.

Figure 7:
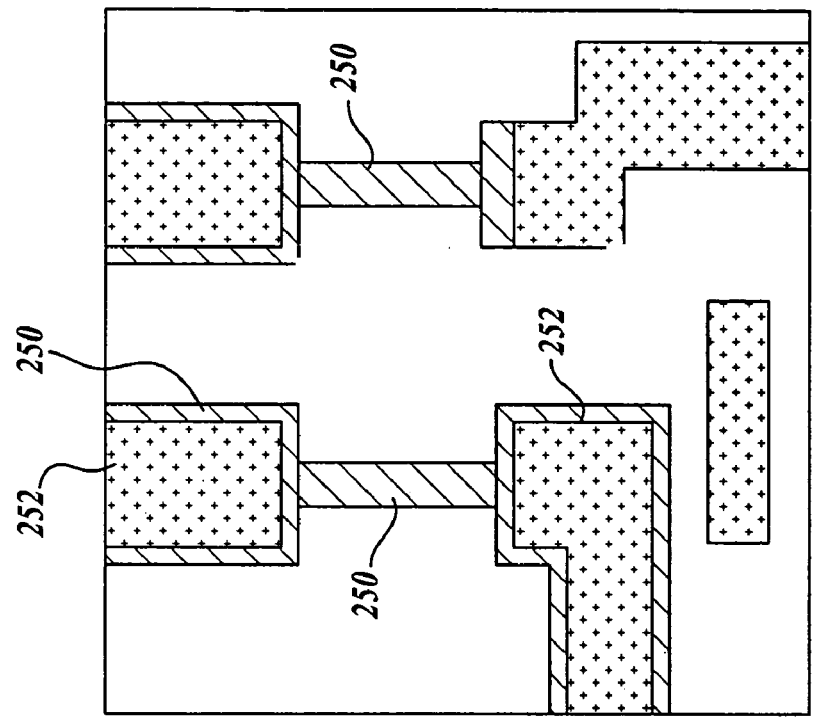
FIG. 7 illustrates the use of the present invention with attenuated phase shifters.

The present invention is not limited to optimizing phase shifters that lie side by side on the mask. As indicated above, phase shifting may be accomplished by using a attenuating phase shifting material on the mask to define circuit elements. Typically, these masks are made using a molybdenum silicide material, in which the thickness and optical properties are controlled to allow the transmission to be small, typically 6–9%, and phase shifted by 180°. In order to limit the total amount of light that passes through the mask, portions of the attenuating material can be covered with an opaque chrome to form a tri-tone mask. FIG. 7 illustrates a plan view of a portion of a mask wherein the mask contains a pattern of attenuating material, which is sometimes referred to as "leaky chrome". In addition some areas of the attenuating material may be covered with an opaque chrome 252. The present invention can optimize the placement of the opaque chrome over the leaky chrome by creating separate data layers for the polygons that define the leaky chrome areas and for the polygons that define the areas of opaque chrome. With the polygons for each area separated, the layout manipulation program can perform calculations to optimize the size of the opaque areas, while still getting the benefits of the phase shifting areas due to the light passing through the attenuating material. Once the polygons in each of the data layers have been optimized, the data layers are provided as input to the mask writer to create the different layers on the photolithographic mask.

While the preferred embodiment of the invention has been illustrated and described, it will be appreciated that various changes can be made therein without departing from the scope of the invention. For example, although use of the present invention is illustrated with respect to creating integrated circuits, it will be appreciated that the present invention can also be used to create micro electro-mechanical structures (MEMS), thin film disk drive heads or other structures created using photolithographic techniques. Similarly, data structures that define different areas of a phase shifter need not be grouped in different data layers. The data structures could be grouped in a common data layer and tagged with an identifier that allows the computer to identify it and perform an optimization calculation prior to assigning a phase shift value. Once the phase shift values are assigned, the different polygons for the phase shift areas having the same phase shift value are preferably written to a single data layer and provided to a mask processor such that the same process steps can be performed on each polygon in the data layer. It is therefore intended that the scope of the invention be determined from the following claims and equivalents thereto.

The embodiments of the invention in which an exclusive property or privilege is claimed are defined as follows:

1. A method for optimizing data to create one or more photolithographic masks using a layout database having a number of data layers, comprising:
   receiving data that represents features to be created in a physical layer of an integrated circuit;
   creating a number of data structures that represent regions of a mask and assigning each data structure to a data layer in a layout database such that data structures are grouped in two or more layers of the layout database;
   analyzing the data structures that are grouped within to the same data layer according to one or more design rules after the data structures have been created; and
   fixing a property of each data structure that is grouped within the same data layer in accordance with the analysis performed such that each data structure in the same data layer has the same property.

2. The method of claim 1, wherein at least some of the data structures represent phase shifting areas on a mask, wherein the data structures that represent adjacent phase shifting areas on the mask are assigned to different data layers in the layout database.

3. The method of claim 2, wherein the property that is fixed for each data structure that represents a phase shifting area is a phase shift amount, and wherein all data structures that represent phase shifting areas within the same data layer are assigned the same phase shift amount.

4. The method of claim 3, wherein the phase shift amount requires that the mask be etched and the design rules select the phase shift amount for the phase shifting areas to minimize the area etched on the mask.

5. The method of claim 3, wherein the phase shift amount requires the application of additional transparent material on the mask, and the design rules select the phase shift amount for the phase shifting areas to minimize the amount of additional transparent material on the mask.

6. The method of claim 3, wherein the property that is fixed for each data structure that represents a phase-shifting area is 180 degrees.

7. The method of claim 3, wherein the property that is fixed for each data structure that represents a phase-shifting area is 270 degrees.

8. The method of claim 3, wherein the property that is fixed for each data structure that represents a phase-shifting area is 90 degrees.

9. The method of claim 2, wherein the property that is fixed for each data structure that represents a phase-shifting area is an amount by which the phase shifting region attenuates transmitted light.

10. The method of claim 1, wherein at least some of the data structures define areas on the mask that are covered by a partially transparent material and are assigned to a first data layer, and some of the data structures define areas on the mask that overlay an area of a partially transparent material with an opaque material and are assigned to a second data layer that is different from the first data layer.

11. The method of claim 1, further comprising the step of: performing a lithographic simulation corresponding to the data structures with the properties assigned.

12. The method of claim 11, further comprising the step of detecting errors in the lithographic simulation and reassigning one or more data structures to another data layer and re-analyzing the data structures in the same data layer according to one or more design rules and refixing the properties of the data structures in the data layer in an iterative process to eliminate any errors.

13. The method of claim 1, wherein the data structures are polygons.

14. The method of claim 1, wherein the physical layer is a gate layer.

15. The method of claim 1, wherein the physical layer is an interconnect layer.

16. A method of optimizing data that define phase shifting areas on a photolithographic mask, comprising:
receiving data that describes features of a physical layer to be created on an integrated circuit;
creating from the data a number of:
data structures that represent areas on the mask that will be opaque or non-opaque to create circuit elements; and
data structures that represent phase shifting regions on the masks, each data structure that represents a phase shifting region having a phase shift amount property;
assigning the data structures to data layers in a layout database, such that data structures that represent adjacent phase shifting regions are grouped in two or more different data layers of layout database;
analyzing the data structures assigned to the same data layer in accordance with one or more design rules after the data structures have been created; and
assigning a common phase shift amount property for all the data structures that represent phase shifting regions and are assigned to the same data layer in accordance with the analysis performed.

17. The method of claim 16, wherein the phase shift amount property of the data structure represents a degree of etching on the mask, and wherein the one or more design rules minimize the etched area on the mask.

18. A method for creating data used to produce one or more photolithographic masks, comprising:
receiving data that represents features in a layer of a wafer to be created with the one or more photolithographic masks;
creating a number of data structures that represent phase shifting areas on the one or more photolithographic masks;
dividing the data structures that represent phase shifting areas into groups such that data structures that represent adjacent phase shifting regions are divided into different groups assigning the data structures that are divided into different groups to different data layers of a layout database;
analyzing the data structures that are commonly grouped with one or more design rules after the data structures have been created; and
assigning a common property to each data structure that is commonly grouped in the same layer of the layout database in accordance with the analysis performed.

19. The method of claim 18, wherein the analysis is performed on the data structures grouped within a same data layer and wherein each data structure in the same data layer is assigned the common property.

20. The method of claim 19, wherein the property is a phase shift amount.

21. The method of claim 20, wherein the phase shift amount is 180 degrees.

22. The method of claim 20, wherein the phase shift amount is 270 degrees.

23. The method of claim 20, wherein the phase shift amount is 90 degrees.

24. The method of claim 19, wherein the property is an amount by which a phase shifting area attenuates transmitted light.

25. A system for creating data used to produce one or more photolithographic masks, comprising:
a database on which is stored data that defines a number of layers of a wafer to be created with the one or more photolithographic masks;
a computer system that executes a sequence of programmed instructions to perform the acts of:
reading data from the database that defines a number of features to be created in a layer of the wafer with the one or more photolithographic masks;
creating a number of data structures that represent phase shifting areas on the one or more photolithographic masks;
grouping the data structures that represent phase shifting areas such that the data structures for adjacent phase shifting areas can be analyzed separately;
analyzing the commonly grouped data structures with one or more design rules after the data structures have been created; and assigning the same property to each commonly grouped data structure in accordance with the analysis performed.

26. A computer readable media on which is stored a sequence of programmed instructions that when executed by a computer, cause it to perform the acts of:

receiving data that represents features in a layer of a wafer to be created with the one or more photolithographic masks;

creating a number of data structures that represent phase shifting areas on the one or more photolithographic masks;

dividing the data structures that represent phase shifting areas into groups such that data structures that represent adjacent phase shifting regions are divided into different groups;

analyzing the data structures that are commonly grouped with one or more design rules after the data structures have been created; and assigning a property of each data structure that is commonly grouped in accordance with the analysis performed such that each of the commonly grouped data structures is assigned the same property.

27. A system for producing one or more photolithographic masks, comprising:

means for storing data that defines one or more layers of a wafer to be created with the one or more photolithographic masks;

computer means for receiving the data and creating a number of data structures that represent areas on the one or more photolithographic masks at least some of which represent phase shifting areas, the computer means further dividing the data structures that represent phase shifting areas into groups, analyzing the data structures that are commonly grouped according to one or more design rules after the data structures are created and assigning the same phase shift amount to the commonly grouped data structures in accordance with the analysis performed.

28. A photolithographic mask that is produced by:

receiving data that represents features in a layer of a wafer to be created with the one or more photolithographic masks;

creating a number of data structures that represent phase shifting areas on the one or more photolithographic masks;

dividing the data structures into groups such that data representing adjacent phase shifting regions are in different groups;

analyzing the commonly grouped data structures with one or more design rules after the data structures have been created; and assigning the same property to each of the commonly grouped data structures in accordance with the analysis performed.

29. A computer readable media on which a sequence of instructions are stored that are executable by a computer to perform any of the method claims 1–15 and 6–9.

30. A computer readable media on which a sequence of instructions are stored that are executable by a computer to perform any of the method claims 16–17.

31. A computer readable media on which a sequence of instructions are stored that are executable by a computer to perform any of the method claims 18–20.

* * * * *

UNITED STATES PATENT AND TRADEMARK OFFICE
CERTIFICATE OF CORRECTION

PATENT NO. : 7,174,531 B2  Page 1 of 1
APPLICATION NO. : 10/811418
DATED : February 6, 2007
INVENTOR(S) : Schellenberg et al.

It is certified that error appears in the above-identified patent and that said Letters Patent is hereby corrected as shown below:

Claim 29, column 12, line 25, "method claims 1-15 and 6-9" should read --method claims 1-15--.

Signed and Sealed this

Fourth Day of March, 2008

JON W. DUDAS
*Director of the United States Patent and Trademark Office*